(12) United States Patent
Ogura

(10) Patent No.: US 9,219,060 B2
(45) Date of Patent: Dec. 22, 2015

(54) SEMICONDUCTOR DEVICE

(71) Applicant: Kabushiki Kaisha Toshiba, Minato-Ku, Tokyo (JP)

(72) Inventor: Tsuneo Ogura, Kanagawa-ken (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 0 days.

(21) Appl. No.: 14/483,831

(22) Filed: Sep. 11, 2014

(65) Prior Publication Data

US 2015/0262999 A1 Sep. 17, 2015

(30) Foreign Application Priority Data

Mar. 14, 2014 (JP) ................. 2014-052702

(51) Int. Cl.

| | | |
|---|---|---|
| H01L 29/76 | (2006.01) | |
| H01L 29/94 | (2006.01) | |
| H01L 31/062 | (2012.01) | |
| H01L 31/113 | (2006.01) | |
| H01L 31/119 | (2006.01) | |
| H01L 27/06 | (2006.01) | |
| H01L 29/739 | (2006.01) | |
| H01L 29/10 | (2006.01) | |
| H01L 29/861 | (2006.01) | |

(52) U.S. Cl.
CPC ........ H01L 27/0635 (2013.01); H01L 29/1095 (2013.01); H01L 29/7397 (2013.01); H01L 29/861 (2013.01)

(58) Field of Classification Search
CPC .............. H01L 21/041; H01L 21/0455; H01L 21/02576; H01L 21/02579; H01L 21/04; H01L 21/0425; H01L 21/048; H01L 21/045; H01L 21/28079; H01L 27/0814; H01L 27/1104; H01L 29/7395; H01L 29/7393; H01L 29/6603; H01L 29/66136; H01L 29/66204; H01L 51/002; H01L 51/102

USPC ............. 257/378, 262, 264, 212, 79, 88, 104, 257/197, 199, 246, 249, 250, 285, 287, 288, 257/389, 410, 509, 510, E21.006, E21.045, 257/E21.046, E21.051, E21.053, E21.054, 257/E21.056, E21.126, E21.127, E21.154, 257/E21.352, E21.366, E21.372, E21.382

See application file for complete search history.

(56) References Cited

U.S. PATENT DOCUMENTS

| | | | | |
|---|---|---|---|---|
| 5,294,825 A | * | 3/1994 | Nakagawa et al. | ........... 257/487 |
| 5,705,835 A | * | 1/1998 | Nishiura et al. | .............. 257/147 |

(Continued)

FOREIGN PATENT DOCUMENTS

| | | |
|---|---|---|
| JP | 2008-181975 A | 8/2008 |
| JP | 2011-114027 A | 6/2011 |
| JP | 2013-065735 A | 4/2013 |

*Primary Examiner* — David Nhu
(74) *Attorney, Agent, or Firm* — White & Case LLP

(57) ABSTRACT

According to one embodiment, a semiconductor device includes first, second, and third electrodes, first, second, third, fourth, fifth, sixth, and seventh semiconductor regions. The first semiconductor region is provided between the first and second electrodes. The second semiconductor region is provided between the first electrode and the first semiconductor region. The third and fourth semiconductor regions are provided between the first electrode and the second semiconductor region. The fifth semiconductor region is positioned between the third semiconductor region and the second electrode, and is provided between the first semiconductor region and the second electrode. The sixth semiconductor region is positioned between the fourth semiconductor region and the second electrode, and is provided between the first semiconductor region and the second electrode. The seventh semiconductor region is provided between the fifth semiconductor region and the second electrode. The third electrode is provided on the seventh, fifth, and first semiconductor regions.

15 Claims, 7 Drawing Sheets

(56) References Cited

U.S. PATENT DOCUMENTS

| | | |
|---|---|---|
| 7,250,639 B1 | 7/2007 | Suekawa |
| 7,473,965 B2 * | 1/2009 | Terashima .................... 257/336 |
| 7,723,783 B2 * | 5/2010 | Saito et al. .................... 257/330 |
| 7,777,249 B2 | 8/2010 | Hamaguchi et al. |
| 8,334,581 B2 * | 12/2012 | Yoshikawa .................... 257/565 |
| 9,024,382 B2 * | 5/2015 | Kitagawa ...................... 257/342 |
| 2011/0254050 A1 | 10/2011 | Udrea et al. |
| 2013/0248882 A1 | 9/2013 | Ogura et al. |
| 2015/0155277 A1 | 6/2015 | Ogura et al. |

* cited by examiner

US 9,219,060 B2

SEMICONDUCTOR DEVICE

CROSS-REFERENCE TO RELATED APPLICATIONS

This application is based upon and claims the benefit of priority from Japanese Patent Application No. 2014-052702, filed on Mar. 14, 2014; the entire contents of which are incorporated herein by reference.

FIELD

Embodiments described herein relate generally to a semiconductor device.

BACKGROUND

A semiconductor device in which a p-type semiconductor region and an n-type semiconductor region are shared by an insulated gate bipolar transistor (IGBT) and a free wheeling diode (FWD). The p-type semiconductor region is a p-type base region for the IGBT and a p-type anode region for the FWD. The n-type semiconductor region is an n-type base region for the IGBT and FWD.

However, when the impurity concentration of the p-type semiconductor region is set to be the same as the impurity concentration of the p-type base region of the IGBT, the recovery time of the FWD may lengthen due to what is for the FWD an excessive injection of holes from the anode side. Further, when the n-type cathode region of the FWD is disposed, if injection of positive holes from the p-type collector region is reduced in the IGBT, negative resistance is more likely to occur. This causes problems such as on voltage becoming higher or balance between chips, when a plurality of chips is arranged in parallel, becoming lost and being destroyed.

DETAILED DESCRIPTION

Figure 1A:
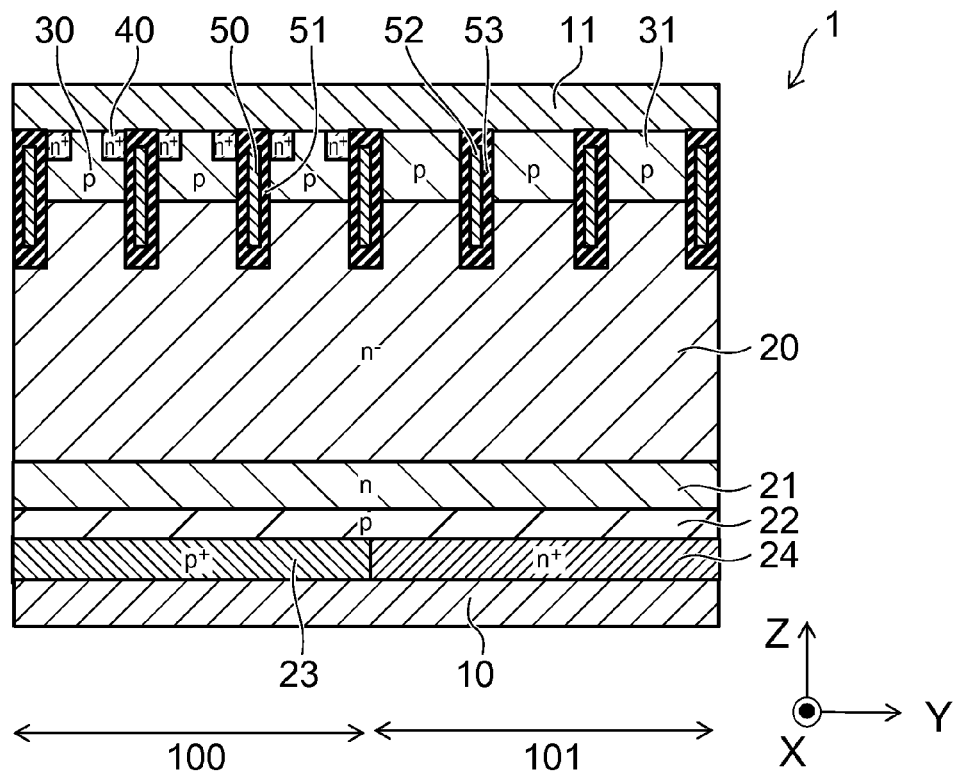
FIG. 1A is a schematic cross-sectional view showing a semiconductor device according to a first embodiment.

According to one embodiment, a semiconductor device includes a first electrode, a second electrode, a first semiconductor region, a second semiconductor region, a third semiconductor region, a fourth semiconductor region, a fifth semiconductor region, a sixth semiconductor region, a seventh semiconductor region, and a third electrode. The first semiconductor region is of a first conductivity type, and is provided between the first electrode and the second electrode. The second semiconductor region is of a second conductivity type, and is provided between the first electrode and the first semiconductor region. The third semiconductor region is of the second conductivity type and the fourth semiconductor region is of the first conductivity type. The third semiconductor region and the fourth semiconductor region are provided between the first electrode and the second semiconductor region, and are aligned along a second direction intersecting with a first direction from the first electrode toward the second electrode. The fifth semiconductor region is of the second conductivity type, is positioned between the third semiconductor region and the second electrode, and is provided between the first semiconductor region and the second electrode. The sixth semiconductor region is of the second conductivity type, is positioned between the fourth semiconductor region and the second electrode, and is provided between the first semiconductor region and the second electrode. The seventh semiconductor region is of the first conductivity type, and is provided between the fifth semiconductor region and the second electrode. The third electrode is provided on the seventh semiconductor region, the fifth semiconductor region, and the first semiconductor region via a first insulating film.

Various embodiments will be described hereinafter with reference to the accompanying drawings. In the following description, the same reference numeral is applied to the same member, and for members that have been described once, the description is omitted as appropriate. Further, in the embodiment, provided that there are no special requirements, elements doped with n-type impurities are represented, in order of decreasing concentration, as $n^+$-type, n-type, and $n^-$-type. Similarly, elements doped with p-type impurities are represented, in order of decreasing concentration as $p^+$-type and p-type.

First Embodiment

Figure 1B:
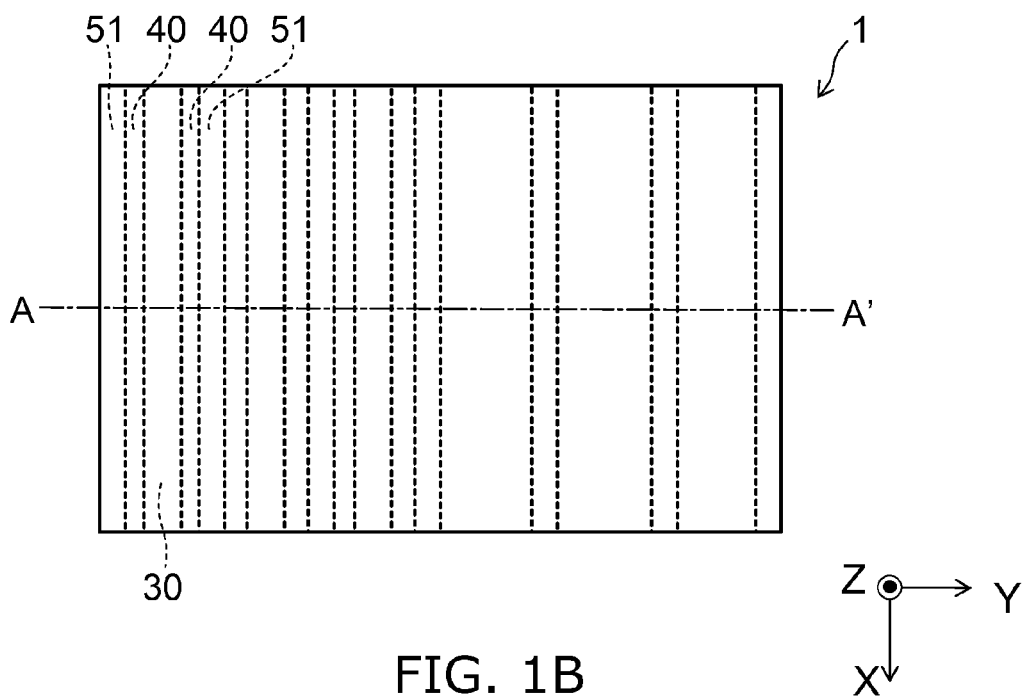
FIG. 1B is a schematic plan view showing the semiconductor device of the first embodiment.

FIG. 1A is a schematic cross-sectional view showing a semiconductor device according to a first embodiment. FIG. 1B is a schematic plan view showing the semiconductor device of the first embodiment.

FIG. 1A shows a cross-section taken through A-A' line in FIG. 1A.

A semiconductor device 1 includes an insulated gate bipolar transistor (IGBT) region 100 in which an IGBT is disposed and a free wheeling diode (FWD) region 101 in which a FWD is disposed. The semiconductor device 1 includes an IGBT and a FWD with a vertical electrode structure.

The semiconductor device 1 includes an electrode 10 (first electrode) and an electrode 11 (second electrode). In the IGBT region 100, the electrode 10 is a collector electrode and the electrode 11 is an emitter electrode. In the FWD region 101, the electrode 10 is a cathode electrode and the electrode 11 is an anode electrode.

An $n^-$-type base region 20 is provided between the first electrode 10 and the second electrode 11. An n-type buffer region 21 is provided between the electrode 10 and the base region 20. The impurity concentration of the buffer region 21 is higher than the impurity concentration of the base region 20. The combination of the base region 20 and the buffer region 21 is described as a first semiconductor region. A p-type shield region 22 (second semiconductor region) is provided between the electrode 10 and the buffer region 21.

A p$^+$-type collector region 23 (third semiconductor region) and an n$^+$-type cathode region 24 (fourth semiconductor region) are provided between the electrode 10 and the shield region 22. The p$^+$-type collector region 23 and the n$^+$-type cathode region 24 are aligned along a Y direction (second direction) that intersects with a Z direction (first direction) from the electrode 10 toward the electrode 11. In other words, the p$^+$-type collector region 23 is disposed in the IGBT region 100 and the n$^+$-type cathode region 24 is disposed in the FWD region 101. An impurity concentration of the collector region 23 is higher than an impurity concentration of the shield region 22. An impurity concentration of the cathode region 24 is higher than an impurity concentration of the buffer region 21.

A p-type base region 30 (fifth semiconductor region) is provided between the base region 20 and the second electrode 11. The base region 30 is positioned between the collector region 23 and the base region 30. In other words, the base region 30 is provided in the IGBT region 100.

A p-type anode region 31 (sixth semiconductor region) is provided between the base region 20 and the electrode 11. The anode region 31 is positioned between the cathode region 24 and the electrode 11. In other words, the anode region 31 is provided in the FWD region 101. The anode region 31 has a Schottky contact or a low-resistance contact with the electrode 11.

An n$^+$-type emitter region 40 (seventh semiconductor region) is provided between the base region 30 and the electrode 11. An impurity concentration of the emitter region 40 is higher than an impurity concentration of the base region 20.

A gate electrode 50 (third electrode) contacts the emitter region 40, the base region 30, and the base region 20 via a gate insulating film 51 (first insulating film). In other words, the gate electrode 50 is provided in the IGBT region 100. A plurality of the gate electrodes 50 is provided in the IGBT region 100 and aligned in the Y direction. The gate electrode 50 is a so-called trench gate.

A plurality of electrodes 52 (fourth electrodes) contacts the anode region 31 and the base region 20 via an insulating film 53 (second insulating film). The plurality of electrodes 52 is aligned in the Y direction. Note that, while not shown in the drawings, the electrodes 52 may be electrically connected to the electrode 11.

The base region 30 and the anode region 31 can be formed simultaneously using a wafer process. The impurity concentration of the base region 30 and the impurity concentration of the anode region 31 may be the same or differ.

Further, if a set of the gate electrode 50 and gate insulating film 51 or a set of the electrode 52 and insulating film 53 is formed as a trench region, the trench region formed by the gate electrode 50 and the gate insulating film 51 and the trench region formed by the electrode 52 and the insulating film 53 can be formed simultaneously using a wafer process. The IGBT region 100 and the FWD region 101 are separated, with the trench region as a boundary therebetween. Specifically, the semiconductor device 1 is a reverse conduction-type IGBT.

The main component of each of the semiconductor regions provided between the electrode 10 and the electrode 11 is, for example, silicon (Si). The main component of each of the semiconductor regions may also be silicon carbide (SiC), gallium nitride (GaN) or the like. For the n$^+$-type, n-type and n$^-$-type conductivity type (first conductivity type) impurity element, phosphorus (P), arsenic (As) or the like may be used. For the p$^+$-type and p-type conductivity type (second conductivity type) impurity elements, boron (B) or the like may, for instance, be used. In the semiconductor device 1, similar effects can be obtained by reversing the p-type and n-type conductivity types.

The material of the electrode 10 and the material of the electrode 11 are metal containing at least one selected from the group consisting of aluminum (Al), titanium (Ti), nickel (Ni), tungsten (W), gold (Au), or the like. The material of the gate electrode 50 and the electrode 52 may, for instance, include polysilicon. Further, the material of the insulating film may include, for instance, silicon oxide.

Before describing the operation of the semiconductor device, the operation of a semiconductor device of a reference example will be described.

Figure 2:
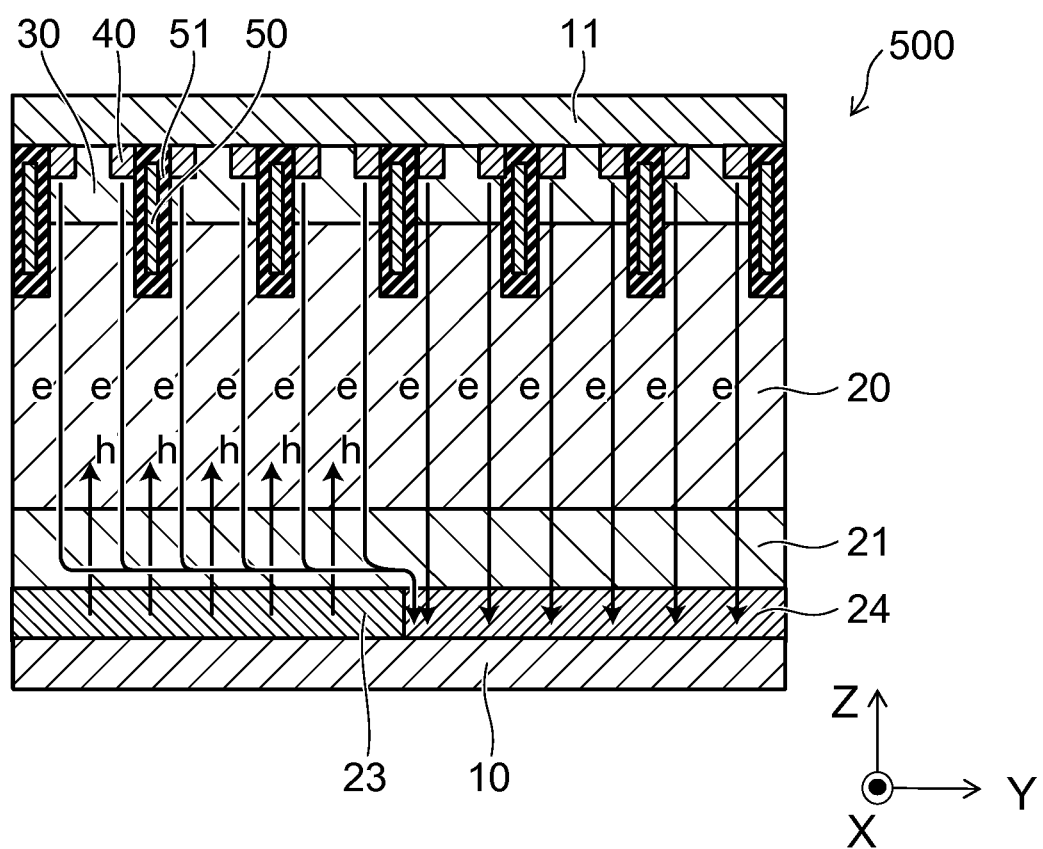
FIG. 2 is a schematic cross-sectional view showing an example of operations of the semiconductor device according to reference example.

FIG. 2 is a schematic cross-sectional view showing an example of operations of the semiconductor device according to reference example.

Here, a semiconductor device 500 is not provided with the above-described p-type shield region 22. Further, the gate electrode 50 and the emitter region 40 are provided over an entire area of the cathode region 24. Thus, the semiconductor device 500 is a reverse conduction-type IGBT.

In the semiconductor device 500, when a higher potential is applied to the electrode 10 (collector electrode) than the electrode 11 (emitter electrode) and a potential not less than the threshold value is applied to the gate electrode 50, a channel is formed in the base region 30 along the gate insulating film 51, and a current flows between the emitter and collector.

Here, electrons (e) injected from the n$^+$-type emitter region 40 toward the p$^+$-type collector region 23 flow to the n$^+$-type cathode region 24 which has the lowest potential on the electrode 10 side. At this time, a majority of the electrons (e) move sideways on the p$^+$-type collector region 23 and flow to the cathode region 24.

As a result of the sideways movement of the electrons (e), a voltage is dropped over the collector region 23, so that the p$^+$-type collector region 23 is positively biased and the buffer region 21 is negatively biased. Consequently, holes (h) are injected from the p$^+$-type collector region 23 toward the emitter side.

In other words, in the ON state, electrons (e) are injected from the emitter side and holes (h) are injected from the collector side, and a large current flows between the emitter and collector.

However, to cause the injection of holes (h) from the collector region 23 by using the voltage drop resulting from the electron current, the width of the collector region 23 in the Y direction must be not less than 500 μm. Accordingly, in the reference example, the IGBT and FWD have to be integrated with a wide spacing. The wider the width of the collector region 23, the more difficult it becomes to disperse within the semiconductor device 500 the heat generated by the IGBT when the semiconductor device 500 is in the ON state. On the other hand, if the width of the collector region 23 in the Y direction is not greater than 500 μm, the injection of positive holes from the collector region 23 is reduced, making it more likely that negative resistance will occur.

The following describes an example of the operations of the semiconductor device according to the first embodiment.

Figure 3A:
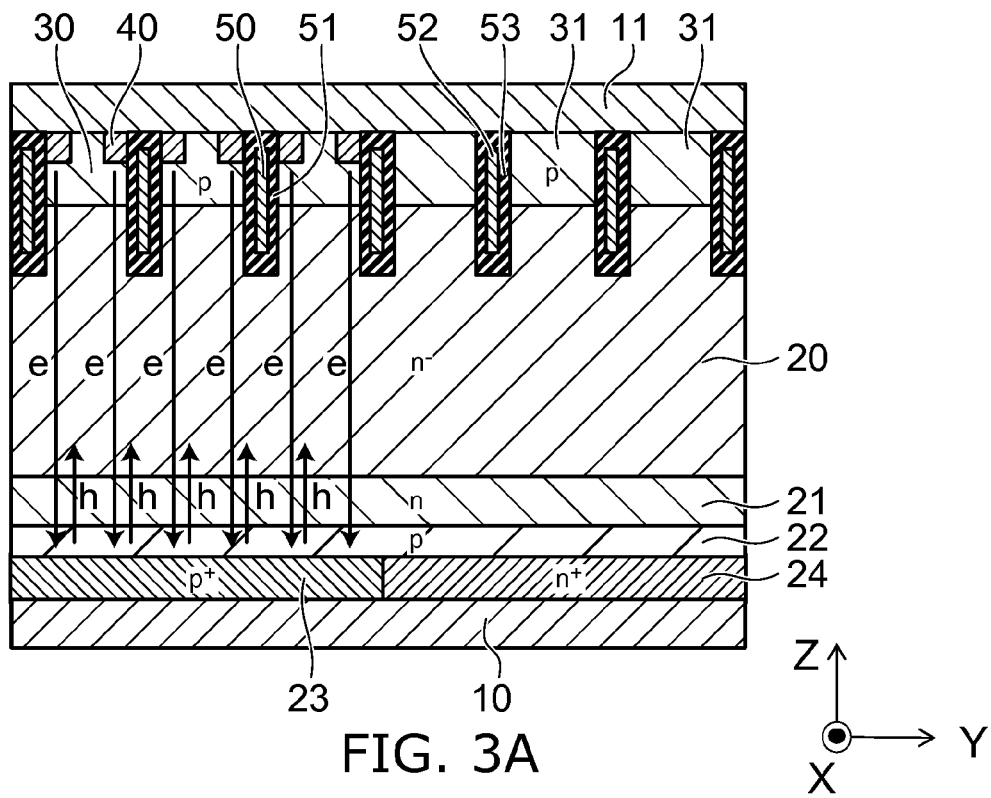
FIG. 3A and FIG. 3B are schematic cross-sectional views showing an example of operations of the semiconductor device according to the first embodiment.
Figure 3B:
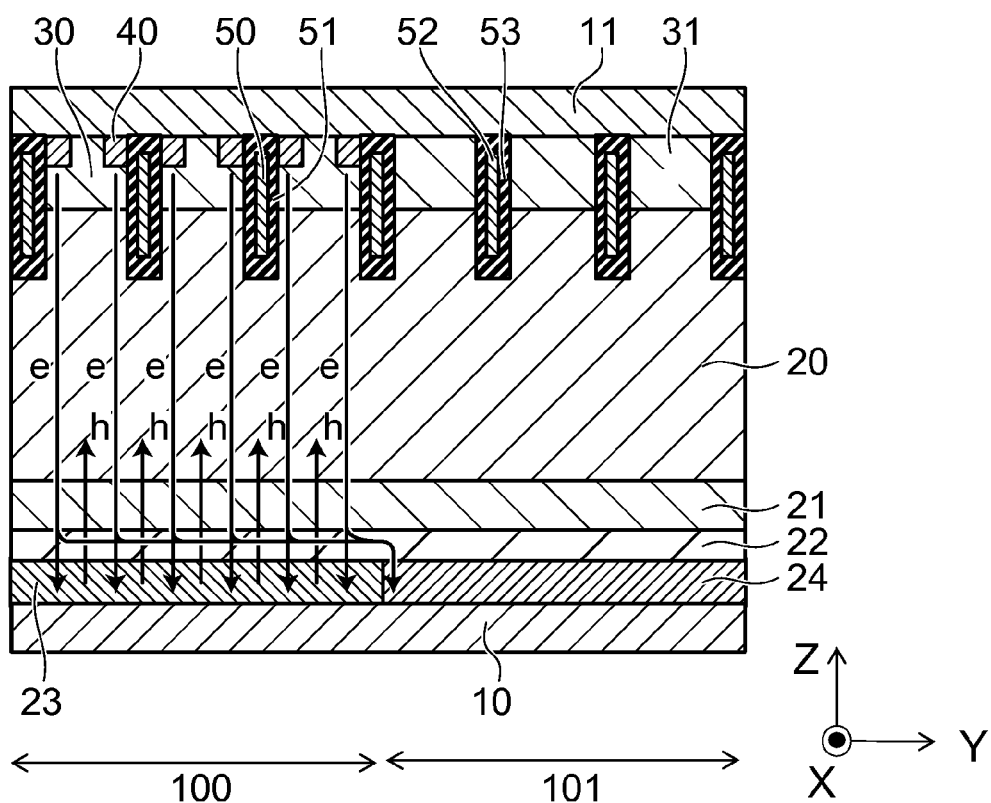

FIG. 3A and FIG. 3B are schematic cross-sectional views showing an example of operations of the semiconductor device according to the first embodiment.

In FIG. 3A and FIG. 3B, an example of the semiconductor device 1 is shown in which the IGBT is operating.

In the semiconductor device 1, when a higher potential is applied to the electrode 10 (collector electrode) than the electrode 11 (emitter electrode) and a potential of at least the threshold value is applied to the gate electrode 50, a channel is formed in the base region 30 along the gate insulating film 51 and a current flows between the emitter and collector.

In this case, the p-type shield region 22 is provided on the collector region 23 and on the cathode region 24. Accordingly, the electrons (e) injected from the n$^+$-type emitter region 40 toward the p$^+$-type collector region 23 flow into the p-type shield region 22.

In other words, before flowing into the n$^+$-type cathode region 24, which has the lowest potential for the electrons (e) on the electrode 10 side, the electrons (e) flow into the p-type shield region 22. Thus, the flow of the electrons (e) to the cathode region 24 is shielded by the shield region 22 on the cathode region 24. As a result of the injection of the electrons (e) to the p-type shield region 22, holes (h) are also injected from the p-type shield region 22 toward the emitter side This state is shown in FIG. 3A.

Next, the majority of the electrons (e) move sideways on the p$^+$-type collector region 23 and flow to the n$^+$-type cathode region 24 which has the lowest potential to the electrons (e) on the electrode 10 side.

As a result of the sideways movement of the electrons (e), a voltage is dropped over the collector region 23, so that the p$^+$-type collector region 23 is positively biased and the shield region 22 is negatively biased.

Consequently, holes (h) are also injected from the p$^+$-type collector region 23 toward the emitter side. At this time, the electrons (e) are injected from the shield region 22 to the collector region 23. This state is shown in FIG. 3B.

Thus, with the semiconductor device 1, holes are injected from the shield region 22 when the electrons (e) are injected into the shield region 22, and holes are also injected from the collector region 23 when the electrons (e) are injected into the collector region 23, irrespective of the width of the collector region 23 in the Y direction. Thus, in the semiconductor device 1, holes (h) are injected from the collector side to the emitter side with a low current. As a result, a negative resistance is less likely to be generated in the forward direction of the IGBT.

Figure 4:
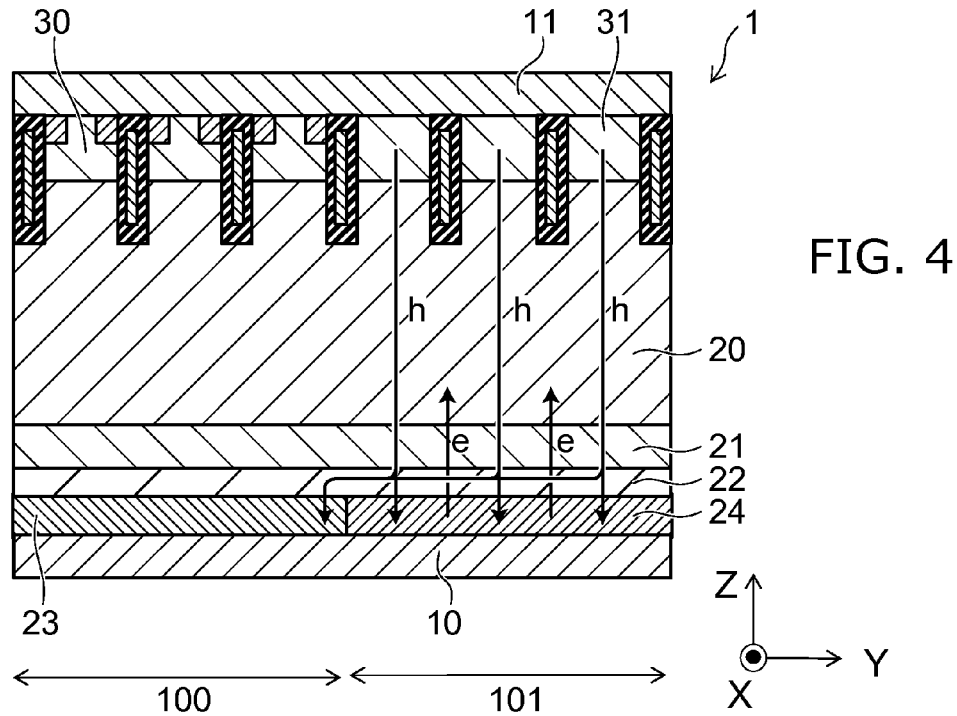
FIG. 4 is a schematic cross-sectional view showing an example of operations of the semiconductor device according to the first embodiment.

FIG. 4 is a schematic cross-sectional view showing an example of operations of the semiconductor device according to the first embodiment.

In FIG. 4, an example of the semiconductor device 1 is shown in which the FWD is operating.

As described above, the p-type shield region 22 is provided on the collector region 23 and on the cathode region 24. Accordingly, the holes (h) injected from the anode region 31 to the base region 20 flow to the shield region 22.

Thereafter, the majority of the holes (h) move sideways on the n$^+$-type cathode region 24 and flow to the p$^+$-type collector region 23 which has the lowest potential to the holes (h) on the electrode 10 side.

As a result of the sideways movement of the holes (h), a voltage is dropped over the cathode region 24, so that the n$^+$-type cathode region 24 is negatively biased and the shield region 22 is positively biased. Here, if the impurity concentration of the shield region 22 is set to be sufficiently lower than that of the collector region 23, and further to be substantially impurity concentration of the buffer region 21, which is to say, a maximum impurity concentration of not higher than $1\times10^{16}$ cm$^{-3}$, the voltage drop becomes larger and the shield region 22 is positively biased more easily. A great advantage of this arrangement is that the impurity concentration of the shield region 22 differs from the impurity concentration of the buffer region 21, and so design can performed without concern for the withstand voltage or the like. Consequently, electrons (e) are injected from the n$^+$-type cathode region 24 toward the emitter side.

Thus, in the semiconductor device 1, electrons (e) are injected from the cathode side to the anode side at a low current. As a result, negative resistance is less likely to be generated in the forward direction of the FWD.

As a comparative example, there is a method in which the base region 30 of the IGBT and the anode region 31 of the FWD are formed from the same p-type region. However, with such a method, if the impurity concentration of the shared p-type region is set to the impurity concentration of the base region 30 of the IGBT, hole injection from the anode side will be excessive for the FWD. Specifically, the recovery time for the FWD will be too long.

Moreover, if the n$^+$-type cathode region that forms a portion of the FWD is present under the shared p-type region, the area of the p$^+$-type collector region is reduced. Here, area is the contact area between the p$^+$-type collector region and the collector electrode. Consequently, the injection of holes from the p$^+$-type collector region is reduced and negative resistance in the IGBT is more likely to occur.

In particular, if the IGBT is used as a switching element, there is a risk that unpredictable noise will be generated as a result of the negative resistance. Also, if there is variation in the negative resistance, current will concentrate in elements in which the rise in current is fast, and these elements may be selectively damaged as a result. The result is a reduction in the reliability of the semiconductor device.

By contrast, in the semiconductor device 1, the IGBT region 100 and the FWD region 101 are separated. Hence, the impurity concentration of the base region 30 and the impurity concentration of the anode region 31 can be adjusted separately. Hence, the impurity concentration of the anode region 31 can be adjusted so that the recovery time for the FWD is short. Further, for the IGBT, holes (h) are injected from the collector side at low current and so negative resistance is less likely to be generated.

Moreover, since the semiconductor device 1 has the trench region, avalanching occurs at the lower end of the trench region in the IGBT and FWD, and avalanche resistance increases.

Second Embodiment

Figure 5:
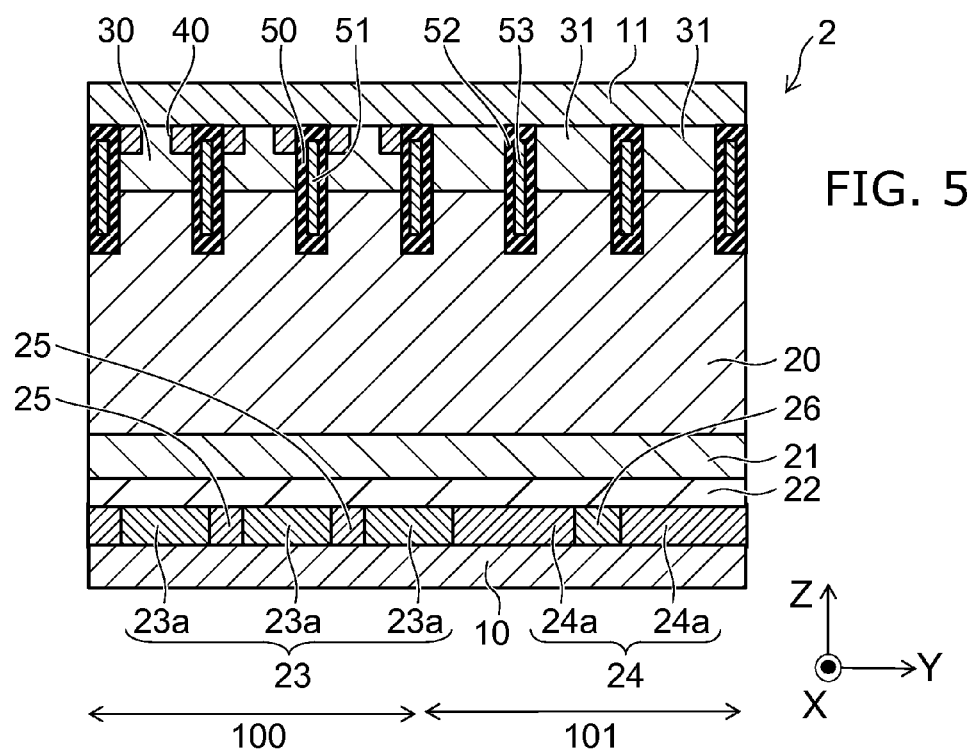
FIG. 5 is a schematic cross-sectional view showing a semiconductor device according to a second embodiment.

FIG. 5 is a schematic cross-sectional view showing a semiconductor device according to a second embodiment.

Besides configuration of the semiconductor device 1, a semiconductor device 2 includes an n$^+$-type semiconductor region 25 (eighth semiconductor region) and a p$^+$-type semiconductor region 26 (ninth semiconductor region) on the electrode 10 side.

For example, the collector region 23 is divided into a plurality of regions 23a (first regions) in the Y direction. The semiconductor region 25 is sandwiched between adjacent regions 23a in the Y direction. Also, the cathode region 24 is divided into a plurality of regions 24a (second regions) in the Y direction. The semiconductor region 26 is sandwiched between adjacent regions 24a in the Y direction.

With such a configuration, the contact area between the collector region 23 and the electrode 10 in the IGBT can be adjusted, thus allowing optimal adjustment of the level of hole injection from the collector side. As a result, the switching speed of the IGBT can be increased. Moreover, in the FWD, the contact area between the cathode region 24 and the electrode 10 can be adjusted, thus allowing optimal adjustment of the level of electron injection from the cathode side.

As a result, the recovery speed of the FWD can be increased. The width of the regions 24a in the Y direction may be wider than that of the semiconductor region 25. Alternatively, the contact area between the regions 24a and the electrode 10 may be larger than the contact area between the semiconductor region 25 and the electrode 10. With such a configuration, speed-up of both the IGBT and FWD can be achieved. This is because voltage fluctuations during switching occur if the electron injection of the FWD is excessively suppressed.

Third Embodiment

Figure 6:
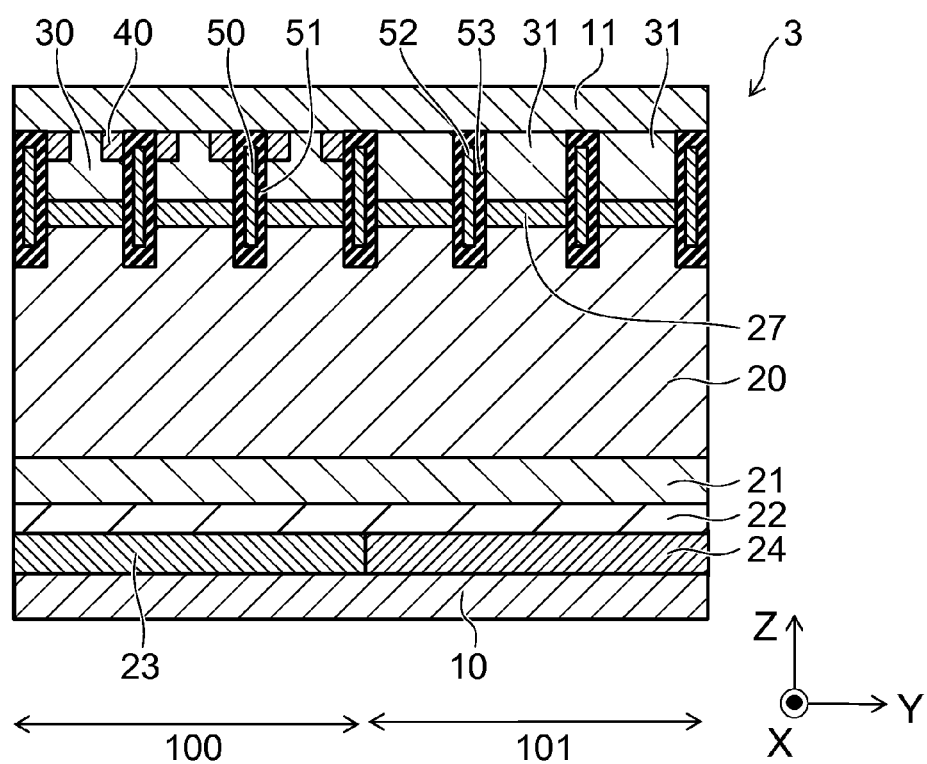
FIG. 6 is a schematic cross-sectional view showing a semiconductor device according to a third embodiment.

FIG. 6 is a schematic cross-sectional view showing a semiconductor device according to a third embodiment.

In addition to the configuration of the semiconductor device 1, a semiconductor device 3 is provided with an n-type barrier region 27 (eleventh semiconductor region) between the n⁻-type base region 20 and the p-type base region 30, and between the n⁻-type base region 20 and the p-type anode region 31.

As a result, in the IGBT, carriers (holes) collect more easily under the barrier region 27 when the IGBT is in the ON state, and conductivity modulation occurs more easily. Consequently, on-resistance is further reduced.

Meanwhile, in the FWD, the presence of the barrier region 27 suppresses carrier (hole) injection from the anode region 31. As a result, the recovery speed of the FWD is further increased.

Fourth Embodiment

Figure 7A:
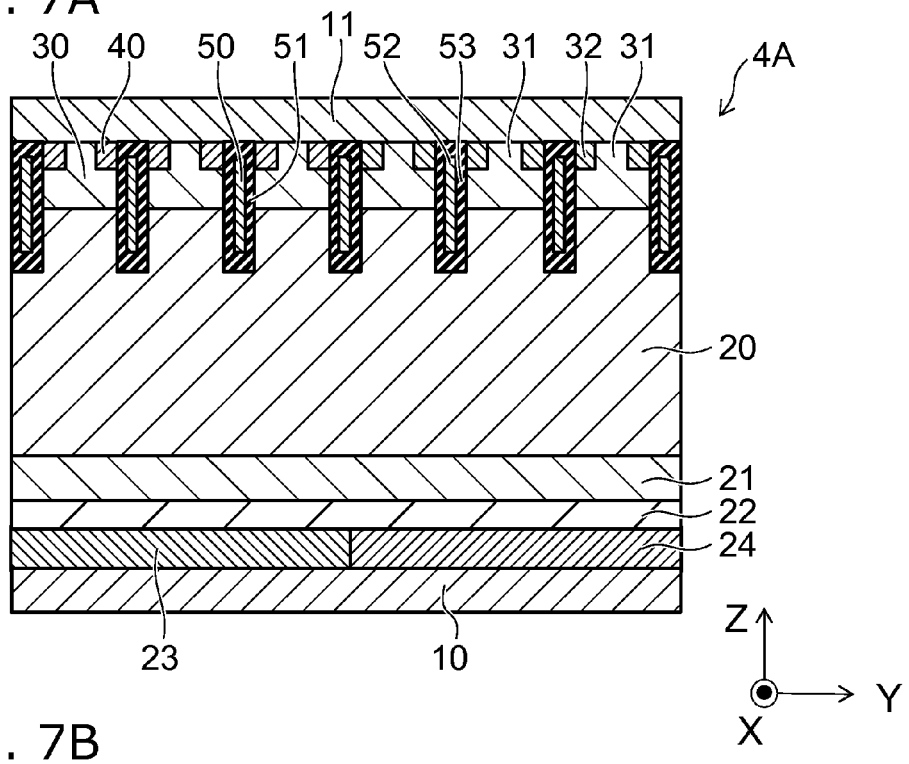
FIG. 7A is a schematic cross-sectional view showing a semiconductor device according to a first example of a fourth embodiment.
Figure 7B:
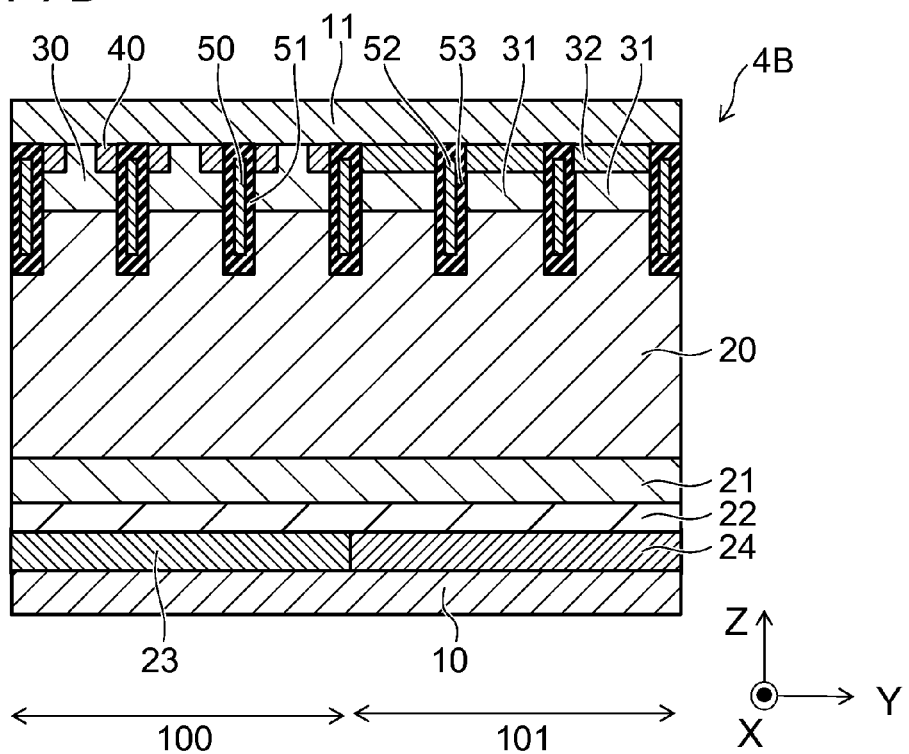
FIG. 7B is a schematic cross-sectional view showing a semiconductor device according to a second example of the fourth embodiment.

FIG. 7A is a schematic cross-sectional view showing a semiconductor device according to a first example of a fourth embodiment, and FIG. 7B is a schematic cross-sectional view showing a semiconductor device according to a second example of the fourth embodiment.

Besides configuration of the semiconductor device 1, a semiconductor device 4A shown in FIG. 7A includes a p⁺-type semiconductor region 32 (tenth semiconductor region).

The p⁺-type semiconductor region 32 is provided between the electrode 11 and the anode region 31. The semiconductor region 32 contacts the insulating film 53. The impurity concentration of the semiconductor region 32 is higher than the impurity concentration of the anode region 31.

Further, as shown in FIG. 7B, the semiconductor region 32 is sandwiched between the adjacent electrodes 52 via the insulating film 53 and may be continuous between the adjacent electrodes 52, in the Y direction.

Figure 8A:
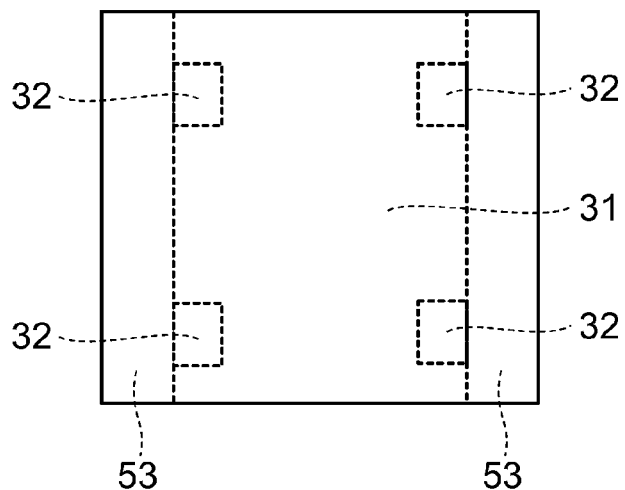
FIG. 8A to FIG. 8C are schematic plan views showing a semiconductor device of the fourth embodiment.
Figure 8B:
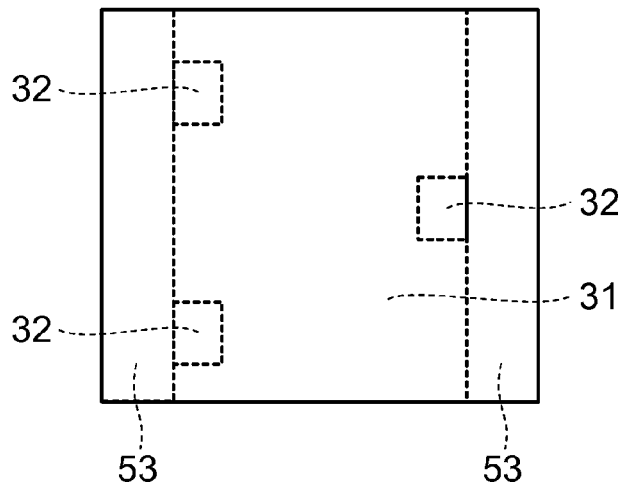
Figure 8C:
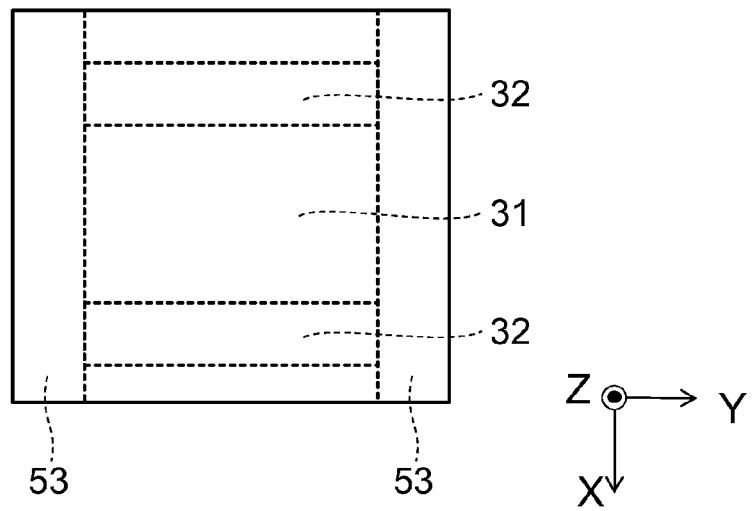

FIG. 8A to FIG. 8C are schematic plan views showing a semiconductor device of the fourth embodiment.

When the semiconductor device 4A is seen in plan view, the semiconductor region 32 is aligned in the X direction intersecting with the Z direction and the Y direction, as shown in FIG. 8A. Further, the semiconductor regions 32 aligned in the X direction do all not have to be disposed to be in phase, and may be staggered as shown in FIG. 8B. The semiconductor region 32 is aligned in the X direction when the semiconductor device 4B is seen in plan view, as shown in FIG. 8C. Thus, the semiconductor region 32 is divided into a plurality of regions in the X direction.

With such a configuration, a ratio of the contact area between the semiconductor region 32 and the electrode 10 and the contact area between the anode region 31 and the electrode 10 can be adjusted in the FWD, thus allowing optimal adjustment of the level of hole injection from the anode side. As a result, the recovery speed of the FWD can be further increased.

Although the embodiments are described above with reference to the specific examples, the embodiments are not limited to these specific examples. That is, design modification appropriately made by a person skilled in the art in regard to the embodiments is within the scope of the embodiments to the extent that the features of the embodiments are included. Components and the disposition, the material, the condition, the shape, and the size or the like included in the specific examples are not limited to illustrations and can be changed appropriately.

The components included in the embodiments described above can be combined to the extent of technical feasibility and the combinations are included in the scope of the embodiments to the extent that the feature of the embodiments is included. Various other variations and modifications can be conceived by those skilled in the art within the spirit of the invention, and it is understood that such variations and modifications are also encompassed within the scope of the invention.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the invention.

What is claimed is:

1. A semiconductor device comprising:
a first electrode;
a second electrode;
a first semiconductor region of a first conductivity type between the first electrode and the second electrode;
a second semiconductor region of a second conductivity type between the first electrode and the first semiconductor region;
a third semiconductor region of the second conductivity type between the first electrode and the second semiconductor region and a fourth semiconductor region of the first conductivity type between the first electrode and the second semiconductor region, the third semiconductor region and the fourth semiconductor region being aligned in a second direction, the second direction intersecting with a first direction from the first electrode toward the second electrode;
a fifth semiconductor region of the second conductivity type between the third semiconductor region and the second electrode, the fifth semiconductor region being provided between the first semiconductor region and the second electrode;
a sixth semiconductor region of the second conductivity type between the fourth semiconductor region and the second electrode, the sixth semiconductor region being provided between the first semiconductor region and the second electrode;
a seventh semiconductor region of the first conductivity type between the fifth semiconductor region and the second electrode; and
a third electrode provided on the seventh semiconductor region, the fifth semiconductor region, and the first semiconductor region via a first insulating film.

2. The semiconductor device according to claim 1, further comprising an eighth semiconductor region of the first conductivity type,
the third semiconductor region being divided into a plurality of first regions in the second direction, and
the eighth semiconductor region being sandwiched between the adjacent first regions in the second direction.

3. The semiconductor device according to claim 1, further comprising a ninth semiconductor region of the second conductivity type,
the fourth semiconductor region being divided into a plurality of second regions in the second direction, and
the ninth semiconductor region being sandwiched between the adjacent second regions in the second direction.

4. The semiconductor device according to claim 1, further comprising a plurality of fourth electrodes provided on the sixth semiconductor region and the first semiconductor region via a second insulating film,
the fourth electrodes being aligned in the second direction.

5. The semiconductor device according to claim 1, further comprising a tenth semiconductor region of the second conductivity type between the second electrode and the sixth semiconductor region, the tenth semiconductor region contacting the second insulating film, and the tenth semiconductor region having a higher impurity concentration than the sixth semiconductor region.

6. The semiconductor device according to claim 1, further comprising an eleventh semiconductor region of the first conductivity type between the first semiconductor region and the fifth semiconductor region and between the first semiconductor region and the sixth semiconductor region.

7. The semiconductor device according to claim 2, further comprising a plurality of fourth electrodes provided on the sixth semiconductor region and the first semiconductor region via a second insulating film,
the fourth electrodes being aligned in the second direction.

8. The semiconductor device according to claim 2, further comprising a ninth semiconductor region of the second conductivity type,
the fourth semiconductor region being divided into a plurality of second regions in the second direction, and
the ninth semiconductor region being sandwiched between the adjacent second regions in the second direction.

9. The semiconductor device according to claim 2, further comprising a tenth semiconductor region of the second conductivity type between the second electrode and the sixth semiconductor region, the tenth semiconductor region contacting the second insulating film, and the tenth semiconductor region having a higher impurity concentration than the sixth semiconductor region.

10. The semiconductor device according to claim 3, further comprising a plurality of fourth electrodes provided on the sixth semiconductor region and the first semiconductor region via a second insulating film,
the fourth electrodes being aligned in the second direction.

11. The semiconductor device according to claim 10, wherein at least one of the plurality of fourth electrodes is electrically connected to the second electrode.

12. The semiconductor device according to claim 3, further comprising a tenth semiconductor region of the second conductivity type between the second electrode and the sixth semiconductor region, the tenth semiconductor region contacting the second insulating film, and the tenth semiconductor region having a higher impurity concentration than the sixth semiconductor region.

13. The semiconductor device according to claim 4, further comprising a tenth semiconductor region of the second conductivity type between the second electrode and the sixth semiconductor region, the tenth semiconductor region contacting the second insulating film, and the tenth semiconductor region having a higher impurity concentration than the sixth semiconductor region.

14. The semiconductor device according to claim 13, wherein the tenth semiconductor region is divided into a plurality of third regions in a third direction intersecting with the first direction and the second direction.

15. The semiconductor device according to claim 5, wherein, in the second direction, the tenth semiconductor region is sandwiched between adjacent fourth electrodes via the second insulating film, and
the tenth semiconductor region is divided into a plurality of third regions in a third direction intersecting with the first direction and the second direction.

* * * * *